United States Patent [19]
Marriott et al.

[11] 3,900,353
[45] Aug. 19, 1975

[54] HIGH STRENGTH ALUMINUM INTERCONNECTIONS FOR MICROELECTRONICS PACKAGING

[75] Inventors: Carroll L. Marriott; Hans E. Patzer, both of Ellicott City; Ronald D. Hall, Baltimore, all of Md.; Charles D. Caposell, Alexandria, Va.; Aaron David Klein, Olney, Md.

[73] Assignee: The United States of America as represented by the Secretary of the Navy, Washington, D.C.

[22] Filed: May 16, 1974

[21] Appl. No.: 470,695

[52] U.S. Cl. ........................ 156/3; 29/629; 156/11; 252/79.4

[51] Int. Cl.[2] ........................................... C23F 1/02

[58] Field of Search ................. 156/3, 8, 11, 18, 22; 317/101; 252/79.4, 79.1; 29/629; 174/68.5

[56] References Cited

UNITED STATES PATENTS

| | | | |
|---|---|---|---|
| 3,399,452 | 9/1968 | Reid | 156/3 X |
| 3,455,751 | 7/1969 | Frantzen | 156/3 |

*Primary Examiner*—William A. Powell
*Attorney, Agent, or Firm*—R. S. Sciascia; P. Schneider

[57] ABSTRACT

A method for making a supported-beam segment comprising the steps of:

coating a section of film carrier material on both top and bottom surfaces with a film of metal;

forming an image of the desired carrier-strip shape on the top film and the desired beams on the bottom film;

etching away on the top surface all of the conductive film except that covering the carrier strip;

etching away on the bottom surface all of the conductive material except that comprising the desired beams;

etching away all film carrier material except that comprising the carrier strip;

after bonding the beams to other electrical elements so as to form interconnections between said elements, etching away the remaining conductive film on the top surface of the carrier strip and then etching away the carrier strip material itself, leaving only the bonded beams and their associated electrical elements.

5 Claims, 7 Drawing Figures

HIGH STRENGTH ALUMINUM INTERCONNECTIONS FOR MICROELECTRONICS PACKAGING

BACKGROUND OF THE INVENTION

This invention relates to interconnections for microelectronic circuits and especially to high-strength metallic interconnections for such circuits.

Technology advances in the recent past have resulted in fuller utilization of integrated microelectronic circuits. Very large hybrids including MOS memories have bridged the gap between simpler packages and full-wafer approaches. Full-wafer packaging is now a reality and reliable techniques for accommodating the wafers are required. Among the needed techniques are those for making strong interconnections between wafer and package and between package and package.

SUMMARY OF THE INVENTION

The invention comprises a method for making strong electrical interconnections between microelectronic circuits. A sheet of carrier material is used to support a metal film on both of its surfaces. Imaging of the beam shapes and of the desired carrier-strip shape on photoresist material covering the films and etching of the film and of the carrier material produces beams supported by the shaped carrier strip. The beams are then aligned with the conductors they are to connect and are bonded to them. Stripping away the carrier material strip leaves neat and strong electrical interconnections between the circuits.

OBJECTS OF THE INVENTION

An object of this invention is to provide strong interconnections for microelectronic circuits.

Another object is to provide low cost, reliable interconnections for microelectronic circuits.

A further object is to provide interconnections for microelectronic circuits which are suitable for automatic bonding.

DETAILED DESCRIPTION OF THE INVENTION

A piece of film carrier, which may be a plastic material such as polyimide or Dupont's Mylar polyester (ethylene terephthalate) film, is coated on both sides with a film of a metal such as aluminum (Al) by any suitable process, such as electron beam evaporation. The carrier 10 may, for example, be 0.005 "thick and 10" square, although its area and shape depend on the particular application for which the beams are desired.

Figure 1:
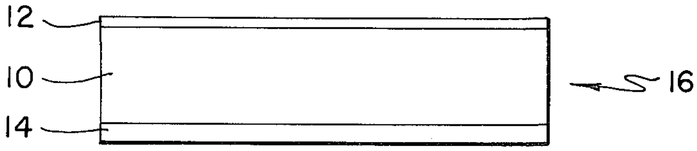
FIG. 1 is a side view of an aluminized film carrier.

One film of Al, which maybe designated the top film 12, is thin, for example, 0.0003 inch. The bottom film 14 is thicker than the upper film and may, for example, be 0.001 inch or more, depending on the desired strength of the beams (interconnections). A side view of the coated film carrier 16 is shown in FIG. 1.

Figure 2A:
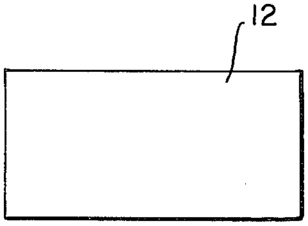
FIGS. 2A–D are plan views showing various stages in the process of forming the beams on the beam carrier strip.
Figure 2B:
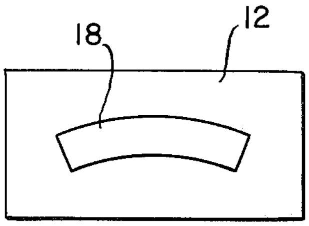
Figure 2C:
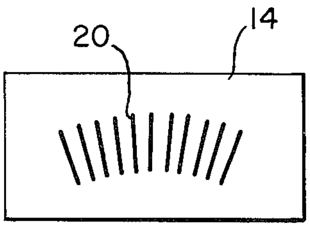

A top view of the aluminized film or coated film carrier 16 is shown in FIG. 2A. The upper and lower films 12 and 14 are then coated with photoresist. Imaging masks are formed which carry the desired shape of the interconnections, or beams, needed for connecting two or more microelectronic circuits and the shape of the film carrier which will support the beams. In the particular embodiment which is illustrated, the film carrier section, or strip, which supports the beams is arcuate.

The top film 12 is now imaged with the shape 18 of the film carrier strip, and the bottom film 14 is imaged with the shape 20 of the conductors, or beams. The exposed Al on the top film 12 is then etched away, leaving only the Al film covering the strip area 18 of the carrier 10. The carrier material is then etched away everywhere except in the strip area, i.e., below the arcuate Al film.

Figure 2D:
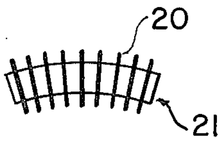

The remaining Al film on both top and bottom surfaces is then etched away except for the beams 20 on the bottom, which overlap the carrier strip to the extent necessary to provide room for bonding (FIG. 2D).

Figure 3:
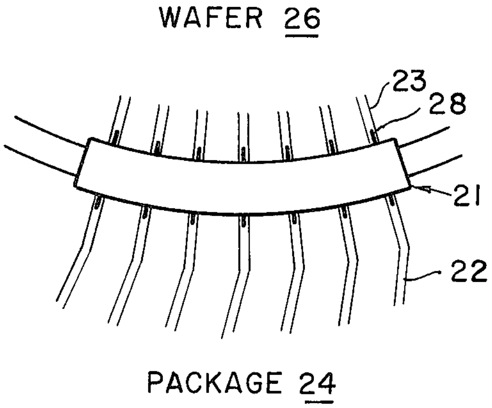
FIG. 3 is a fragmentary schematic showing the bondable segment in place for the bonding operation.

The resulting supported-beam segment 21 is placed over the area which requires interconnections and the beams are bonded to the other connections, preferably by supersonic bonding means (FIG. 3). For example, the beams 20 might extend between the connections 22 to the components of a microcircuit package 24 and the connections 23 to other components on a ceramic wafer 26. The beams 22 are now bonded near their ends (point 28) to the other interconnections.

Figure 4:
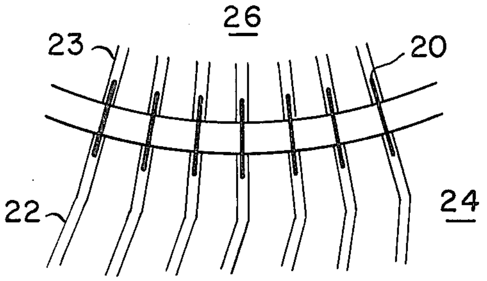
FIG. 4 is a fragmentary schematic showing how the final interconnections look after the carrier has been stripped away.

The final step is stripping off the carrier material, leaving only the beams 20 making the electrical connection between interconnections 22 and 23 (FIG. 4). Altho only a few beams and interconnections are shown, there may actually be a great many. Also, the shape of the carrier strip 18 may be altered in any way which is suitable for the connections which are to be made.

Altho the example of carrier materials which have been given are not metallic, it is possible to use a metal such as copper, for example. The etch material would then have to be suitable for etching whatever metal carrier is used.

A solution suitable for etching aluminum could be the following at a temperature of 95° C.:

300 ml $H_3PO_4$
200 ml $CH_3COOH$
10 ml $HNO_3$

A solution suitable for etching a polyimide, such as Kapton, could be sixty-five percent by volume of hydrazine in water. This should be agitated and followed by a rinse of hot water for about 1 minute after the Kapton is dissolved. Follow this by a rinse in methanol and allow to dry.

The uniqueness of the technique is the resulting relationship of the conductors and the film carrier. The carrier and its beams are placed on position and bonded to the subject parts. The film carrier is then stripped away leaving uniform, his strength, all-metallic interconnections, which may be aluminum or some other metal.

One of the main attributes of this invention is that it produces interconnections of a fixed shape and pattern. This allows the bonding task to be automated. In addition, since the shape of the conductors can be varied, higher strength interconnections can be produced. The specific strength (tensile strength/specific gravity) of the aluminum interconnections is approximately 4 times as great as that of gold wire (0.001 inch diam.). This feature combined with the automation of the bonding process yields high reliability, low cost interconnections, which can be desiged to fit almost any microcircuit package.

Obviously, many modifications and variations of the present invention are possible in light of the above teachings. It is therefore to be understood that, within the scope of the appended claims, the invention may be practiced otherwise than as specifically described.

What is claimed is:

1. A method for making a supported-beam interconnecting segment comprising the steps of:

coating a section of film carrier material on both top and bottom surfaces with a film of electrically conductive material;

forming an image of the desired carrier-strip shape on the top film and the desired beams on the bottom film;

etching away on the top surface all of the conductive film except that covering the carrier strip;

etching away on the bottom surface all of the conductive material except that comprising the desired beams;

etching away all film carrier material except that comprising the carrier strip;

after bonding the beams to other electrical elements so as to form interconnections between said elements, etching away the remaining conductive film on the top surface of the carrier strip and then etching away the carrier strip material itself, leaving only the bonded beams and their associated electrical elements.

2. A method as in claim 1, wherein the film carrier is a polyimide material.

3. A method as in claim 1, wherein the film is made of metal.

4. A method as in claim 1, wherein the film is made of aluminum.

5. A method as in claim 1, wherein the film carrier is a polyimide material and the film is aluminum.

* * * * *